(12) United States Patent
Park et al.

(10) Patent No.: US 7,247,880 B2
(45) Date of Patent: Jul. 24, 2007

(54) THIN FILM TRANSISTOR WITH LOW ANGLE GRAIN BOUNDARIES IN A CHANNEL LAYER

(75) Inventors: Byoung-Keon Park, Incheon-si (KR); Ki-Yong Lee, Yongin-si (KR); Jin-Wook Seo, Suwon-si (KR); Tae-Hoon Yang, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/017,673

(22) Filed: Dec. 22, 2004

(65) Prior Publication Data

US 2006/0006465 A1    Jan. 12, 2006

(30) Foreign Application Priority Data

Jul. 7, 2004    (KR) .................. 10-2004-0052693

(51) Int. Cl.
*H01L 29/10*    (2006.01)
(52) U.S. Cl. .................. 257/64; 257/66; 257/E29.003
(58) Field of Classification Search ............ 257/64–66, 257/70, 72, E29.003
See application file for complete search history.

(56) References Cited

U.S. PATENT DOCUMENTS 6,602,765 B2 *    8/2003    Jiroku et al. ................ 438/487
6,916,690 B2 *    7/2005    Chang ........................ 438/149
6,939,754 B2 *    9/2005    Moriguchi et al. ......... 438/162
2003/0193069 A1 *  10/2003    Park et al. .................. 257/347

FOREIGN PATENT DOCUMENTS

| JP | 07-226374 | 8/1995 |
| JP | 08-097137 | 4/1996 |
| JP | 10-214974 | 8/1998 |
| JP | 11-097352 | 4/1999 |
| JP | 2001-326176 | 11/2001 |
| KR | 10-2003-0060403 A | 7/2003 |

* cited by examiner

*Primary Examiner*—Minh-Loan Tran
(74) *Attorney, Agent, or Firm*—H. C. Park & Associates, PLC

(57) ABSTRACT

A thin film transistor includes a substrate, a semiconductor layer pattern on the substrate, a gate insulating layer on the semiconductor layer pattern, and a gate electrode on a gate insulating layer. Low angle grain boundaries of polysilicon formed in a channel layer in the semiconductor layer pattern are tilted −15 to 15° with respect to a current flowing direction.

5 Claims, 7 Drawing Sheets

THIN FILM TRANSISTOR WITH LOW ANGLE GRAIN BOUNDARIES IN A CHANNEL LAYER

CROSS-REFERENCE TO RELATED APPLICATION

This application claims priority to and the benefit of Korean Patent Application No. 2004-52693, filed Jul. 7, 2004, the disclosure of which is incorporated herein by reference in its entirety.

BACKGROUND OF THE INVENTION

1. Field of the Invention

The present invention relates to a thin film transistor and method of fabricating the same and, more particularly, to a thin film transistor and method of fabricating the same in which a capping layer and a metal catalyst layer are formed on an amorphous silicon layer to crystallize.

2. Description of the Related Art

In general, a polysilicon layer has been widely used as a semiconductor layer for thin film transistor since it has high field effect mobility and may be used in a high-speed circuit and a CMOS circuit. The thin film transistor using the polysilicon layer is generally used in an active device of an active matrix liquid crystal display (AMLCD) and switching and driving devices of an organic light emitting diode (OLED).

Here, the polysilicon layer used in the thin film transistor may be fabricated by a direct deposition method, a high-temperature annealing method and a laser annealing method. The laser annealing method may be used in a low-temperature process and implement the high field effect mobility. However, it requires high-cost laser equipment so that a substitute technology has been widely developed.

Currently, a method of crystallizing amorphous silicon using metal has been widely developed since the crystallization is made at a lower temperature and in a shorter time than that of a solid phase crystallization (SPC) method. The metal crystallization method is classified into a metal induced crystallization (MIC) method and a metal induced lateral crystallization (MILC) method. However, even with the metal crystallization method, the characteristics of the thin film transistor device are degraded due to metal contamination.

Meanwhile, in order to reduce the amount of metal and fabricate a high-quality polysilicon layer, there has been developed a method of fabricating a high-quality polysilicon layer through high-temperature processing, rapid thermal annealing or laser illumination by adjusting a concentration of the metal ion using an ion implanter. In addition, in order to planarize the surface of a polysilicon layer using a metal induced crystallization method, a crystallization method of mixing liquid-phase metal and a viscous organic layer, depositing a thin film thereon using a spin coating method, and annealing the resultant has also been developed. However, even with the aforementioned crystallization method, a large-sized grain and grain uniformity, are still problematic, which is critical in the polysilicon layer.

To solve the foregoing problems, a method of fabricating a polysilicon layer through a crystallization method using a cover layer was disclosed in Korean Patent Application No. 2003-0060403. The method includes: depositing an amorphous silicon layer on a substrate; forming a capping layer on the amorphous silicon layer; depositing a metal catalyst layer on the capping layer; diffusing the metal catalyst into the amorphous silicon layer through the capping layer using laser or annealing to form a seed; and forming a polysilicon layer using the seed. This method may prevent unnecessary metal contamination since the metal catalyst diffuses through the capping layer.

However, even with this method, there still remain problems that it is difficult to control a uniform low concentration of the metal catalyst and also difficult to control a starting position and a direction of the crystal growth and a grain size.

SUMMARY OF THE INVENTION

The present invention, therefore, solves aforementioned problems associated with conventional devices by providing a thin film transistor in which line-shaped seeds are formed by patterning a capping layer, and then crystallized so that device characteristics may be improved and made more uniform by adjusting a position and a direction of the crystal growth.

In an exemplary embodiment according to the present invention, a thin film transistor includes a substrate, and a semiconductor layer pattern is disposed on the substrate. A gate insulating layer is disposed on the semiconductor layer pattern, and a gate electrode is disposed on the gate insulating layer. Low angle grain boundaries formed in a channel layer in the semiconductor layer pattern is tilted −15 to 15° with respect to a current flowing direction. The low angle grain boundaries of polysilicon may be parallel to the current flowing direction. Accordingly, the device characteristics may be improved and made more uniform by adjusting a position and a direction of the crystal growth.

One grain boundary of polysilicon may be formed in the channel layer in the semiconductor layer pattern.

The thin film transistor may further include a buffer layer formed between the substrate and the semiconductor layer pattern. The buffer layer may be made of a silicon nitride layer or a silicon oxide layer.

In another exemplary embodiment according to the present invention, a method of fabricating a thin film transistor includes forming an amorphous silicon layer on a substrate. A capping layer is formed on the amorphous silicon layer such that seeds are formed in a line shape. A metal catalyst layer is formed on the capping layer, and the metal catalyst is subjected to diffusion. The amorphous silicon layer is crystallized and patterned to form a semiconductor layer pattern.

The capping layer comprises at least two layers.

The capping layer comprise a first capping layer on the amorphous silicon layer, and a second capping layer on the first capping layer, and patterning the second capping layer. An interval between the second capping layer patterns is preferably 1 to 50 μm. A phrase "interval between the second capping layer patterns" refers to a distance between one second capping layer pattern and an adjacent second capping layer pattern. The second capping layer pattern is preferably thicker than the first capping layer. In addition, the second capping layer pattern preferably has a higher density than the first capping layer.

In yet another exemplary embodiment according to the present invention, wherein the capping layer comprises a first capping layer on the amorphous silicon layer, and patterning the first capping layer. A second capping layer on the patterned first capping layer. An interval between the patterned first capping layers is 1 to 50 μm. The patterned first capping layer is thicker than the first capping layer. The patterned first capping layer has a higher density than the first capping layer.

In yet another exemplary embodiment according to the present invention, wherein the capping layer comprises a capping layer on the amorphous silicon layer, and forming a groove in the capping. The groove formed in capping layers has a width of 1 to 50 μm.

A distance between the line-shaped seeds is preferably longer than a distance between the seeds in the line-shaped seeds.

A channel layer in the semiconductor layer pattern is preferably formed in the line-shaped seeds apart by at least ½ of the distance between the seeds in the line-shaped seeds.

A difference of the distance between the line-shaped seeds and the distance between the seeds in the line-shaped seeds is larger than a length of the channel layer The capping layer is made of any one of a silicon nitride layer and a silicon oxide layer.

The capping layer is formed by a plasma enhanced chemical vapor deposition (PECVD) method.

The metal catalyst may be formed of nickel (Ni). The metal catalyst layer may be formed by a PECVD method or a sputtering method.

In another exemplary embodiment according to the present invention, a method of fabricating a thin film transistor includes forming an amorphous silicon layer on a substrate. A capping layer is formed on the amorphous silicon. A metal catalyst layer is formed on the capping layer, and the metal catalyst is subjected to diffusion. The amorphous silicon layer is crystallized and patterned to form a semiconductor layer pattern. Wherein a distance between seeds in parallel direction to a current flow direction in the semiconductor layer pattern is longer than a distance between seeds in perpendicular direction to the current flow direction in the semiconductor layer pattern.

The metal catalyst may diffuse through an annealing process. The annealing process is preferably performed at a temperature of 200 to 700° C. The amorphous silicon layer may be crystallized by the annealing process. The annealing process is preferably performed at a temperature of 400 to 1000° C. The diffusion of the metal catalyst and the crystallization of the amorphous silicon layer may be simultaneously performed by the annealing process.

BRIEF DESCRIPTION OF THE DRAWINGS

The above and other features of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1A:
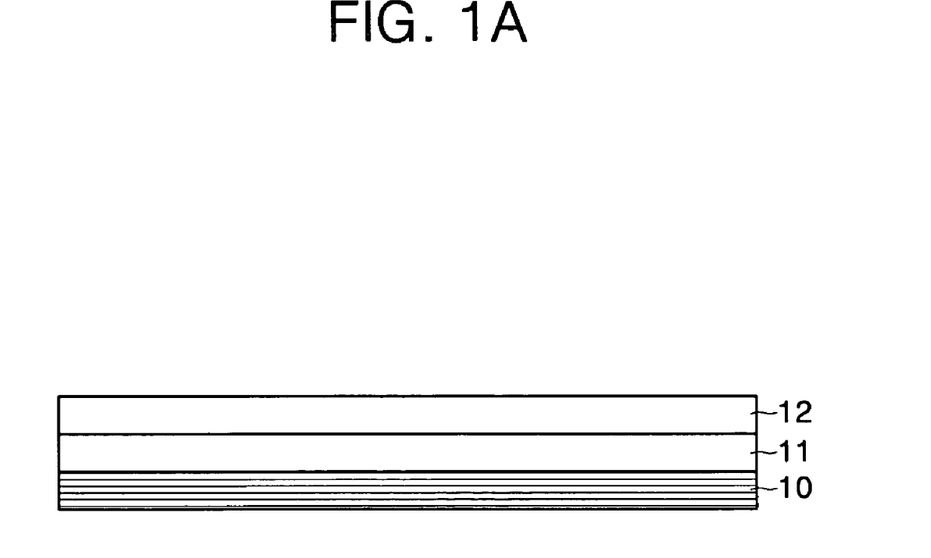
FIGS. 1A to 1F are process diagrams illustrating a method of fabricating a thin film transistor according to a first embodiment of the present invention.
Figure 1B:
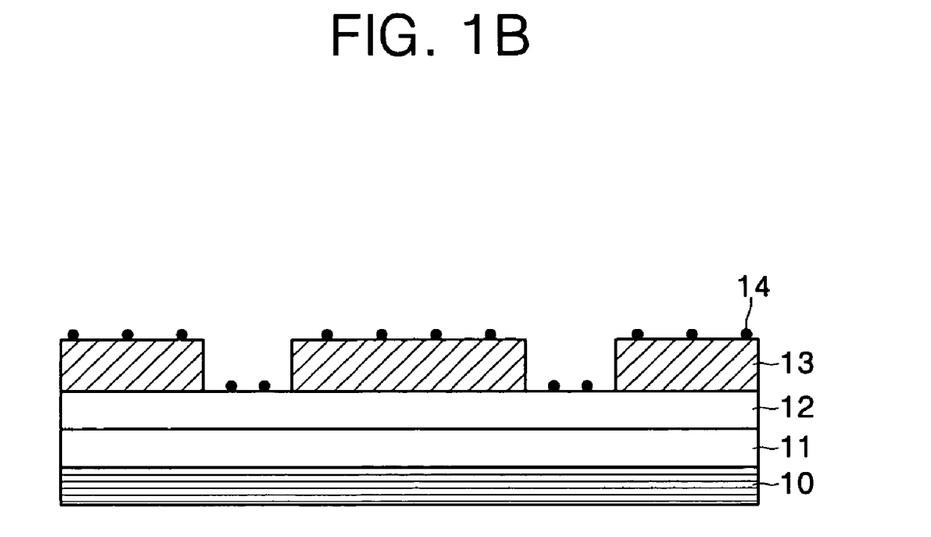
Figure 1C:
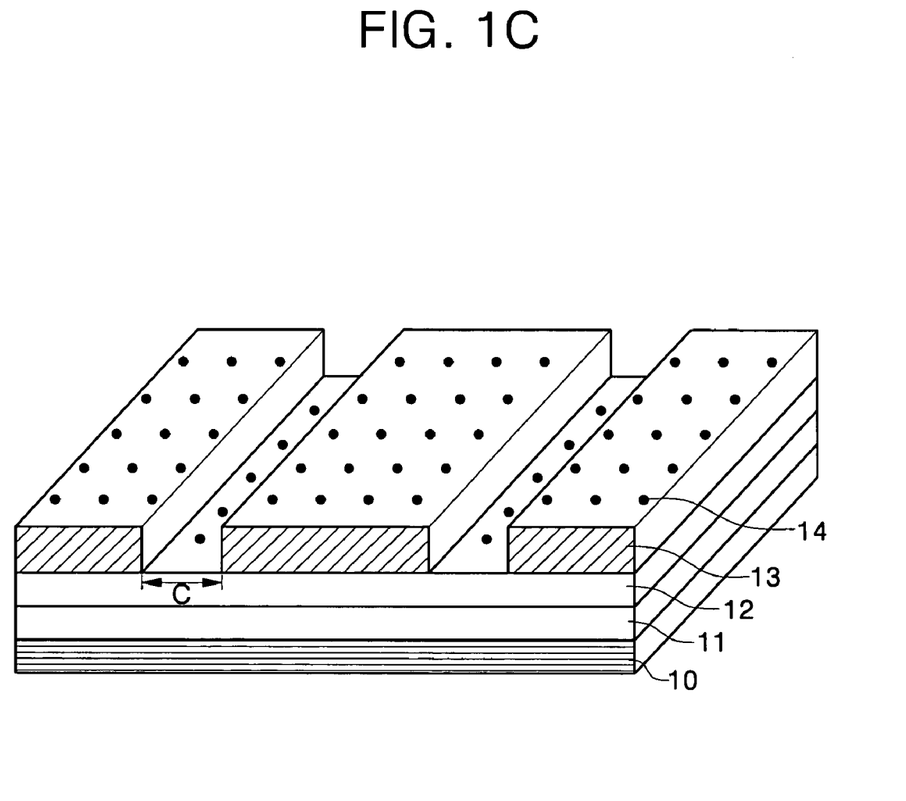
Figure 1D:
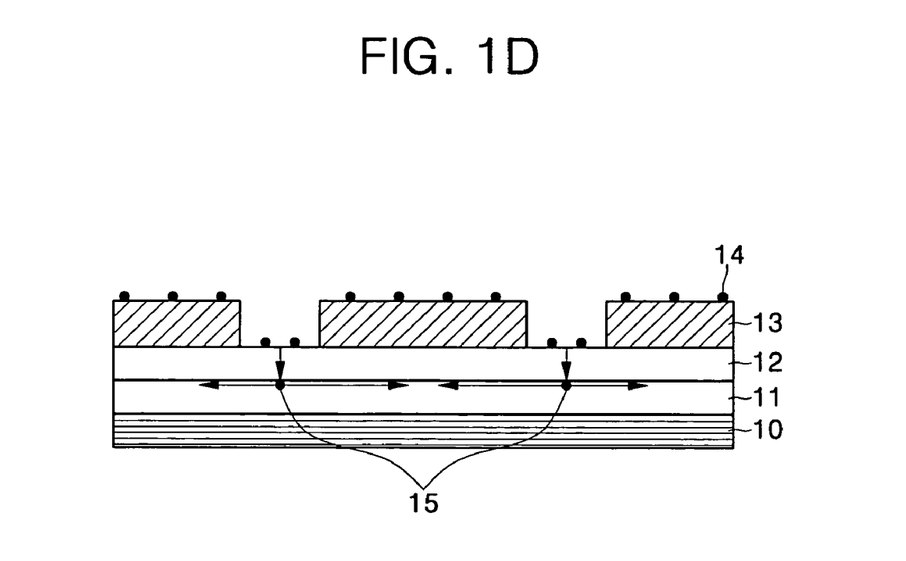
Figure 1E:
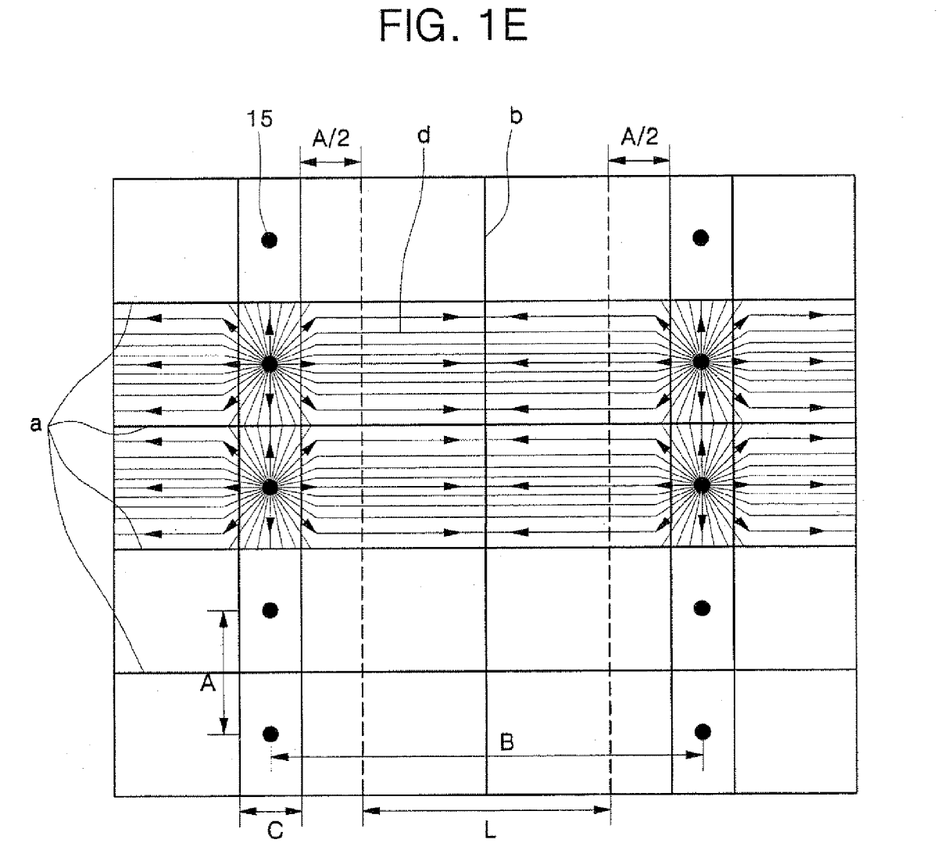
Figure 1F:
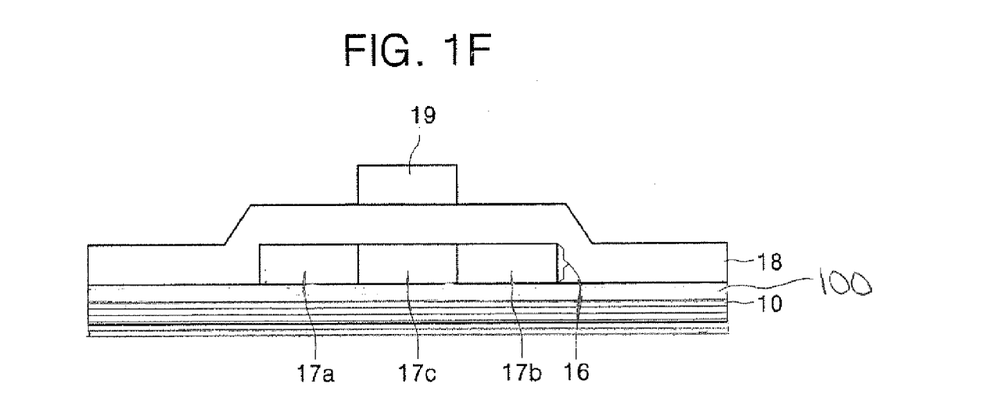
Figure 2:
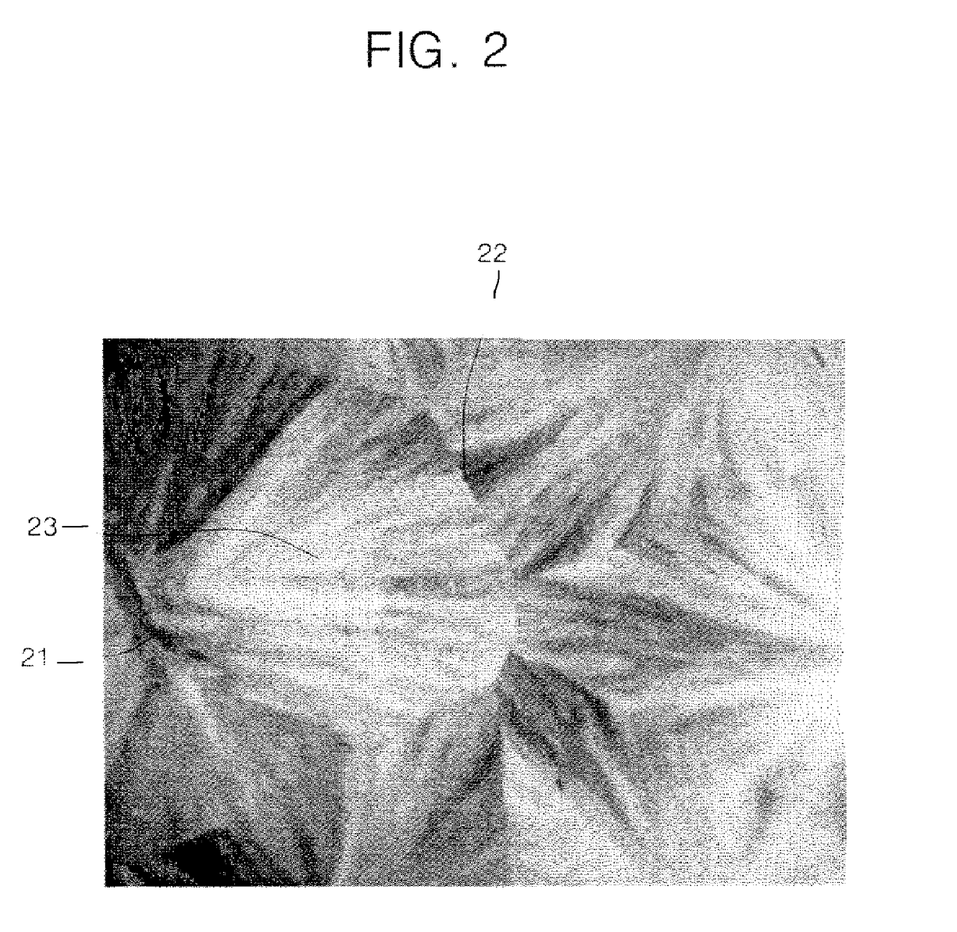
FIG. 2 is a SEM photograph showing a completely grown grain.

FIGS. 1A to 1F are process diagrams illustrating a method of fabricating a thin film transistor according to a first embodiment of the present invention, and FIG. 2 is a scanning electron microscopy (SEM) photograph showing a completely grown grain.

Referring to FIG. 1A, an amorphous silicon layer 11 is deposited on a substrate 10. The substrate 10 is preferably an insulating substrate such as glass. The amorphous silicon layer 11 may be formed by a plasma enhanced chemical vapor deposition (PECVD) method.

A first capping layer 12 is formed on the amorphous silicon layer 11. The first capping layer 12 may be made of a silicon nitride layer or a silicon oxide layer, and may be formed by a PECVD method.

The first capping layer 12 made of the silicon nitride layer or silicon oxide layer is adjusted to have a thin thickness or a low density such that metal catalyst 14 described below may diffuse. In other words, the capping layer 12 serves as a metal catalyst diffusible layer.

Referring to FIG. 1B, a second capping layer is formed on the first capping layer 12 and patterned to form a second capping layer pattern 13. Here, the second capping layer is patterned such that the seed is formed in a line shape as described below. This will be described in more detail with reference to the FIG. 1C.

The second capping layer pattern 13 may be made of a silicon nitride layer or a silicon oxide layer, and adjusted to have a larger thickness or a higher density than the first capping layer 12 such that the metal catalyst described below cannot diffuse. In other words, the second capping layer pattern 13 serves as a metal catalyst non-diffusible layer. In general, an oxide layer or a nitride layer acts as a barrier for impurity diffusion. Thus, the diffusion of the metal catalyst may be prevented with a higher density silicon oxide layer or silicon nitride layer. On the contrary, by lowering the density of the silicon oxide layer or silicon nitride layer, the metal catalyst 14 easily diffuses.

A metal catalyst layer is formed on the second capping layer pattern 13. The metal catalyst 14 is preferably formed of nickel (Ni), and may be deposited using a sputter deposition unit. In addition, it may be formed by ion implantation or plasma. In the method using the plasma, a metal material is arranged on the second capping layer pattern 13 and exposed to plasma to form the metal catalyst 14.

Referring to FIG. 1C, it may be noted that the second capping layer is patterned in a line shape. FIG. 1C is a perspective view of the section shown in FIG. 1B.

Since the second capping layer is patterned in a line shape, the metal catalyst 14 may form a line-shaped seed in the amorphous silicon layer through the diffusion described below.

An interval C between the second capping layer patterns 13 is preferably 1 to 50 μm to form the line-shaped seed and control the metal catalyst 14 at a low concentration. More specifically, when the interval C between the second capping layer patterns 13 exceeds 50 µm, the concentration of the metal catalyst 14 increases so that it is difficult to control the metal catalyst at a low concentration. In addition, since the formed seed increases, it is difficult to form the line-shaped seed.

Referring to FIG. 1D, the metal catalyst 14 is subjected to diffusion. The diffusion may be performed by annealing, i.e., heat treatment at a temperature of 200 to 700° C. for 1 hour, and the metal catalyst 14 diffuses into the amorphous silicon layer 11 via the first capping layer 12 by the annealing process. The diffused metal catalyst 14 forms a seed 15 in the amorphous silicon layer 11. Here, the seed 15 is formed in a line shape as described above. The term "seed" refers to a metal silicide formed when the metal catalyst 14 reacts with silicon. The crystallization described below is performed with the seed 15. In general, only about 1/100 of the metal catalyst 14 diffuses to form the seed 15.

Next, the amorphous silicon layer 11 including the seed 15 formed by the diffusion is crystallized to form a polysilicon layer. The crystallization may be performed by an annealing process, which heats for a long time in a furnace. Here, the temperature of the crystallization is preferably 400 to 1000° C.

When the annealing is performed at the above temperature, the seed 15 laterally grows and come in contact with an adjacent grain to form a grain boundary. Finally, the perfect crystallization may be achieved. The crystallization method having the aforementioned processing sequence is referred to as a super grain silicon method (SGS). The grain formed by the SGS method reaches 20 to 200 µm or 300 µm in diameter.

Here, the seed 15 is formed in a line shape. Thus, at the beginning of the crystallization, the crystallization is made in a radial shape, and later the crystallization proceeds in a direction nearly parallel to the current flowing direction.

FIG. 1E is a plan view of a polysilicon layer where the crystallization is completed.

Referring to FIG. 1E, the seed 15 is formed by diffusion of the metal catalyst 14, and the seed 15 has a line shape. The interval C between the second capping layer patterns 13 refers to a distance between one second capping layer pattern and an adjacent second capping layer pattern, which represents a width of the position where the seed 15 may be formed. B refers to a distance between the line-shaped seeds, and A refers to a distance between seeds in the line-shaped seeds.

As described above, the crystallization is performed by an annealing process, and at the beginning, the crystallization proceeds in a radial shape. As the crystallization proceeds, a grain comes in contact with a grown grain by the adjacent seed in the line-shaped seeds to form a grain boundary (a). Later, the crystallization proceeds in a direction nearly parallel to the current flowing direction. As the seed grows in a direction nearly parallel to the current flowing direction, a grain comes in contact with a grown grain by the adjacent seed in the line-shaped seeds to form a grain boundary (b). Finally, the growth is completed.

In addition, as the crystallization proceeds, a lot of minute grain boundaries are formed in the grains, which are called low angle grain boundaries d. FIG. 1E shows low angle grain boundaries only in some grains.

Referring to FIG. 2, it may be noted that a grain boundary is formed at a region where a grain and another grain adjacent hereto come in contact with each other and the grains stop growing, and that even in the completely grown grains, a lot of low angle grain boundaries 23 are formed in a radial shape centering around a seed 21. The characteristics of the thin film transistor may be changed according to growth directions of the low angle grain boundaries 23 as well as the grain boundaries 22.

Referring to FIG. 1E, according to the present invention, the crystallization is performed by forming the line-shaped seeds. Thus, at the beginning of the crystallization, the low angle grain boundaries (d) are formed in a radial shape, and later formed in a nearly parallel direction to the current flowing direction.

To induce the growth direction in a direction nearly parallel to the current flowing direction, the distance B between the line-shaped seeds is preferably longer than the distance A between the seeds in the line-shaped seeds.

In addition, a channel layer in the semiconductor layer pattern described below is preferably formed in the line-shaped seeds apart by at least ½ of the distance A between the seeds in the line-shaped seeds. Therefore, a channel formation region L where the channel layer is formed may be formed in a region where there exist the low angle grain boundaries (d) having nearly parallel angles to the current flowing direction. According to the present invention, the low angle grain boundaries (d) having an angle of −15 to 15° to the current flowing direction may be formed. In addition, the low angle grain boundaries (d) may be formed parallel to the current flowing direction. A distance between seeds in parallel direction to a current flow direction in the semiconductor layer pattern is longer than a distance between seeds in perpendicular direction to a current flow direction in the semiconductor layer pattern. As described above, when the channel layer is formed in a region where the low angle grain boundaries (d) have an angle of −15 to 15° to the current flowing direction, thin film transistors having improved and more uniform characteristics may be fabricated.

To form the channel layer in a region where the low angle grain boundary (d) is formed, a difference of the distance B between the line-shaped seeds and the distance A between the seeds in the line-shaped seeds is larger than a length of the channel layer. Therefore, the low angle grain boundaries (d) parallel to the current flowing direction may be formed in the channel layer, and only one grain boundary (b) may be formed. Referring to FIG. 1F, the first capping layer 12, the second capping layer pattern 13 and the metal catalyst layer 14 are crystallized, and then removed by an etching process. By removing the structures, the crystallized polysilicon layer may be prevented from unnecessary metal contamination.

Next, the polysilicon layer is patterned, and source and drain regions 17a and 17b and a channel layer 17c are formed by an ion implantation process. In other words, a semiconductor layer pattern 16 is formed. A gate insulating layer 18 is formed on the semiconductor layer pattern 16, and then a metal layer and a photoresist layer are sequentially deposited on the gate insulating layer 18. The photoresist layer is patterned, and the metal layer is etched using the patterned photoresist layer as a mask to form a gate electrode 19. Using the resultant, the thin film transistor may be finally fabricated. Reference numeral 100 of FIG. 1F denotes a buffer layer, which may be arranged between the substrate 10 and the semiconductor layer pattern 16. The buffer layer may be made of a silicon nitride layer or a silicon oxide layer.

FIGS. 3A to 3D are process diagrams illustrating a method of fabricating a thin film transistor according to a second embodiment of the present invention.

Figure 3A:
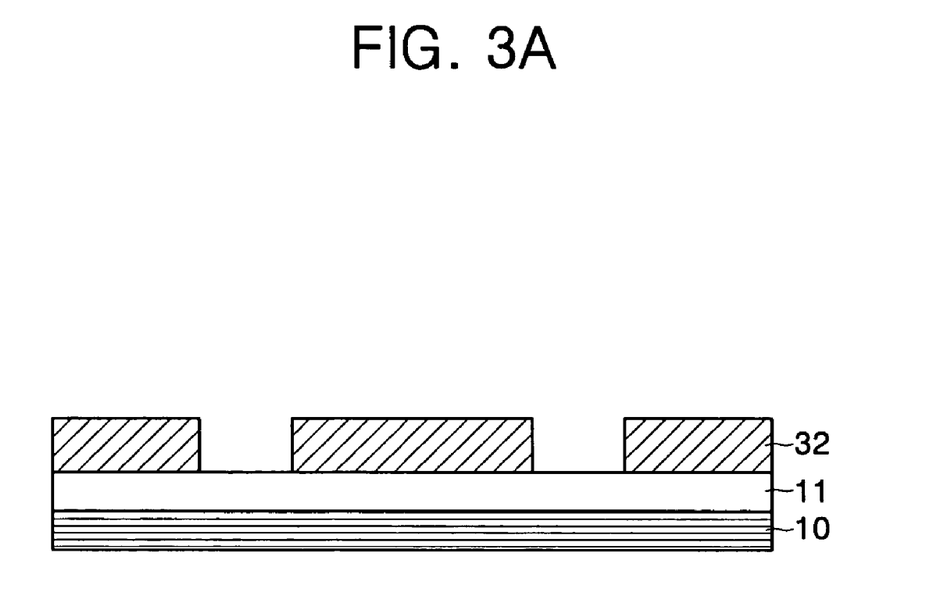
FIGS. 3A to 3D are process diagrams illustrating a method of fabricating a thin film transistor according to a second embodiment of the present invention.

Referring to FIG. 3A, an amorphous silicon layer 11 is deposited on a substrate 10.

A first capping layer is formed on the amorphous silicon layer 11. The first capping layer may be made of a silicon nitride layer or a silicon oxide layer, and may be formed by a PECVD method.

Next, the first capping layer is patterned to form a first capping layer pattern 32. Here, the first capping layer is patterned such that the seed is formed in a line shape as described below.

The first capping layer pattern 32 adjusts such that the silicon nitride layer or silicon oxide layer has a large thickness or a high density to disable the metal catalyst 14 to diffuse. In other words, the first capping layer pattern 32 serves as a metal catalyst non-diffusible layer.

Figure 3B:
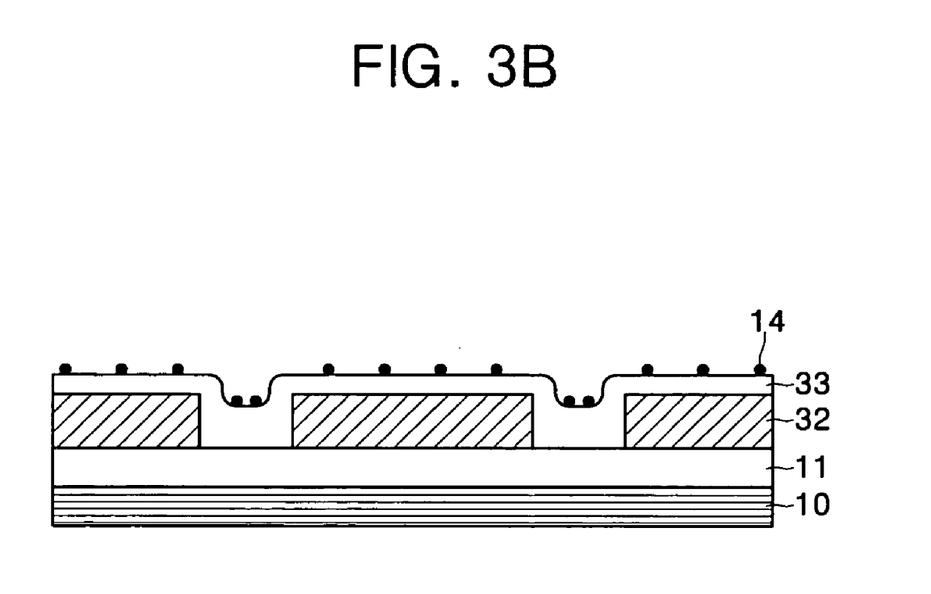

Referring to FIG. 3B, a second capping layer 33 is formed on the first capping layer pattern 32. The second capping layer 33 may be made of a silicon nitride layer or a silicon oxide layer, and may be adjusted to have a smaller thickness or a higher density than the first capping layer pattern 32 such that the metal catalyst 14 may diffuse. In other words, the second capping layer 33 serves as a metal catalyst diffusible layer.

Next, a metal catalyst layer 14 is formed on the second capping layer 33.

Figure 3C:
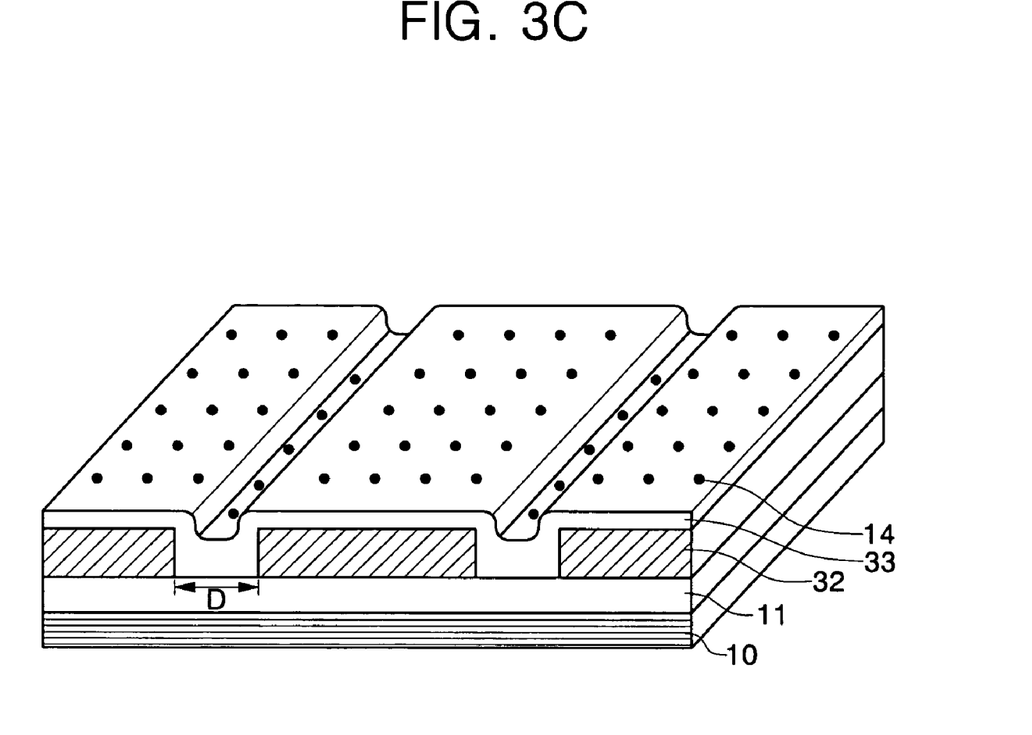

Referring to FIG. 3C, it may be noted that the first capping layer is patterned in a line shape. FIG. 3C is a perspective view of the section shown in FIG. 3B.

Since the first capping layer is patterned in a line shape, the metal catalyst 14 may form line-shaped seeds in the amorphous silicon layer by the diffusion described below. An interval D between the first capping layer patterns 32 is preferably 1 to 50 μm to form the line-shaped seeds and control the metal catalyst 14 at a low concentration. The second capping layer 33 is formed on the line-shaped first capping layer pattern 32.

Figure 3D:
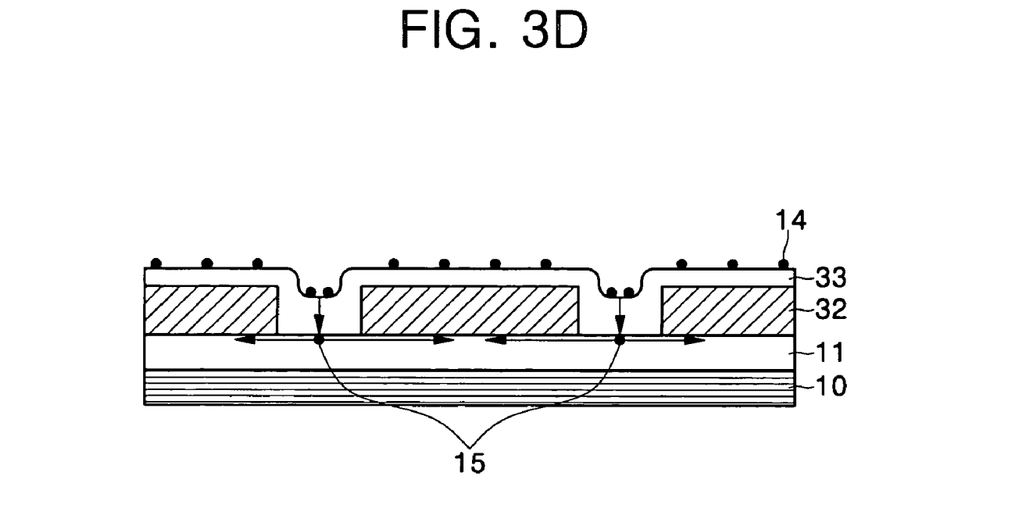

Referring to FIG. 3D, the metal catalyst 14 is subjected to diffusion. The diffusion may be performed by annealing at a temperature of 200 to 700° C. for 1 hour, and the metal catalyst 14 diffuses into the amorphous silicon layer 11 via the second capping layer 33 by the annealing process. The diffused metal catalyst 14 forms a seed 15 in the amorphous silicon layer 11. The metal catalyst 14 not diffused by the first capping layer pattern 32 remains on the second capping layer 33.

The remaining arrangements and functions are the same as those of the thin film transistor according to the first embodiment of the present invention.

Figure 4A:
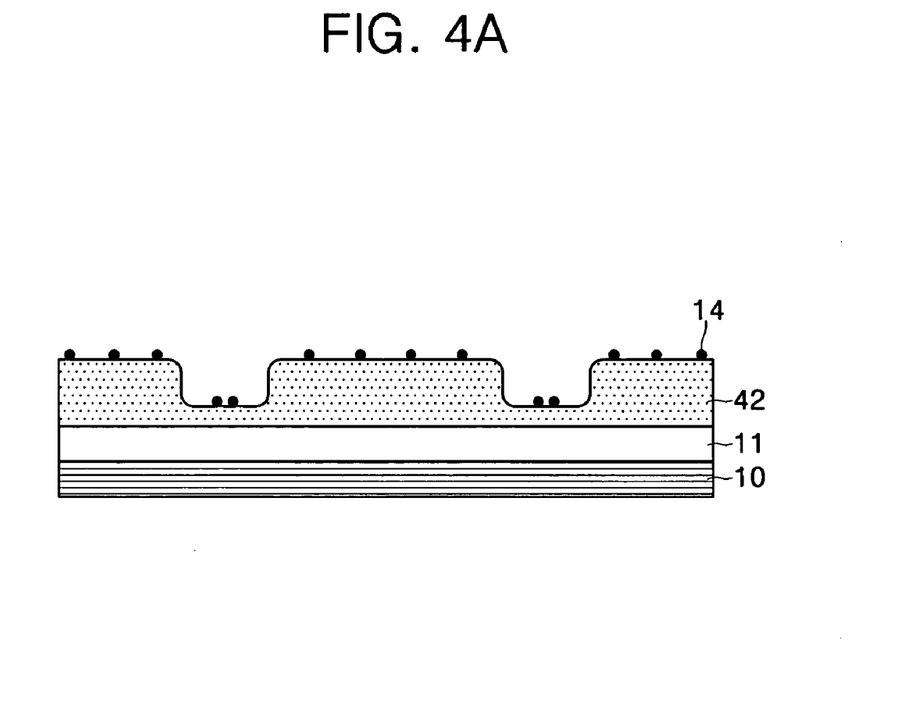
FIGS. 4A and 4B are process diagrams illustrating a method of fabricating a thin film transistor according to a third embodiment of the present invention.
Figure 4B:
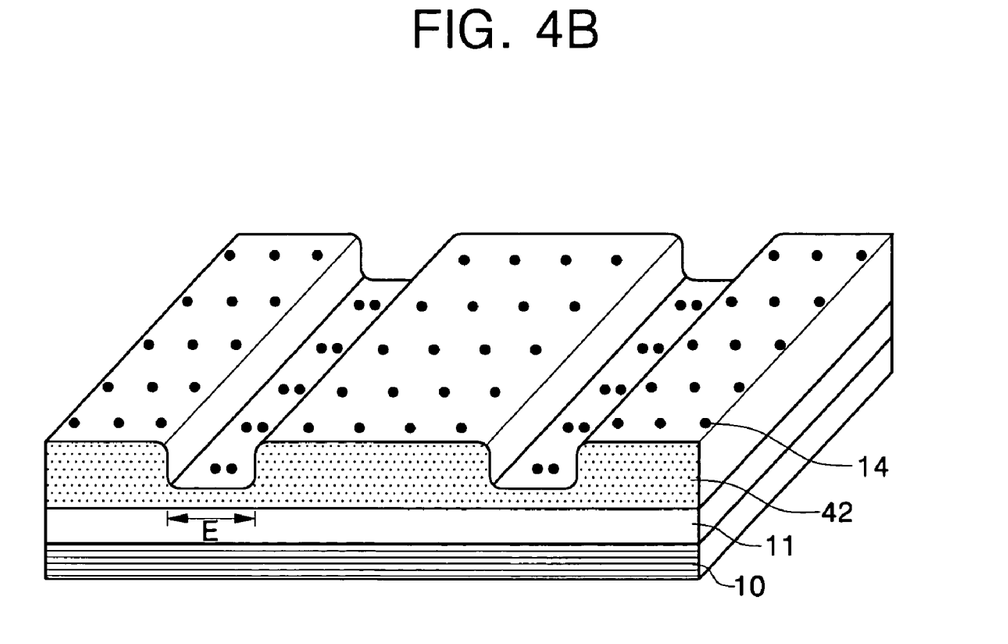

FIGS. 4A and 4B are process diagrams illustrating a method of fabricating a thin film transistor according to a third embodiment of the present invention.

Referring to 4A, a capping layer 42 is formed on a substrate 10 where an amorphous silicon layer 11 is formed, and then a groove is formed in the capping layer 42 such that seeds are formed in a line shape. Next, a metal catalyst layer is formed on the capping layer 42. The capping layer 42 may be made of a silicon nitride layer or a silicon oxide layer, and the portion where the groove is formed is thin so that the metal catalyst 14 may diffuse. Unlike the first and second embodiments of the present invention, only one capping layer is formed in the third embodiment of the present invention.

Referring to FIG. 4B, it may be noted that a line-shaped groove is formed on the capping layer 42. FIG. 4B is a perspective view of the section shown in FIG. 4A.

Since the line-shaped groove is formed in the capping layer 42, the metal catalyst 14 diffuses so that the line-shaped seeds may be formed in the amorphous silicon layer.

A width E formed in the capping layer 42 is preferably 1 to 50 μm to form line-shaped seeds and control the metal catalyst at a low concentration.

The remaining arrangements and functions are the same as those of the thin film transistor according to the first embodiment of the present invention.

As described above, according to a method of fabricating a thin film transistor of the present invention, an amorphous silicon layer is crystallized by an SGS method, to form line-shaped seeds. Thus, a channel layer may be formed in a low angle grain boundary having an angle nearly parallel to the current flowing direction. In other words, the device characteristics may be improved and made more uniform by adjusting a position and a direction of the crystal growth.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor comprising:
   a substrate;
   a semiconductor layer pattern formed on the substrate;
   a gate insulating layer formed on the semiconductor layer pattern; and
   a gate electrode formed on the gate insulating layer,
   wherein low angle grain boundaries of polysilicon formed in a channel layer in the semiconductor layer pattern are tilted −15 to 15° with respect to a current flowing direction.

2. The thin film transistor according to claim 1, wherein the low angle grain boundaries of polysilicon are parallel to the current flowing direction.

3. The thin film transistor according to claim 1, wherein one grain boundary of polysilicon is formed in the channel layer in the semiconductor layer pattern.

4. The thin film transistor according to claim 1, further comprising a buffer layer formed between the substrate and the semiconductor layer pattern.

5. The thin film transistor according to claim 4, wherein the buffer layer is made of any one of a silicon nitride layer and a silicon oxide layer.

* * * * *